United States Patent
Stockbridge

(10) Patent No.: US 12,388,278 B2
(45) Date of Patent: Aug. 12, 2025

(54) BATTERY HEALTH SELF-TEST PROTOCOL

(71) Applicant: Carrier Corporation, Palm Beach Gardens, FL (US)

(72) Inventor: Michael Stockbridge, Canastota, NY (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 812 days.

(21) Appl. No.: 17/584,674

(22) Filed: Jan. 26, 2022

(65) Prior Publication Data

US 2022/0239110 A1    Jul. 28, 2022

Related U.S. Application Data

(60) Provisional application No. 63/141,531, filed on Jan. 26, 2021.

(51) Int. Cl.
*H02J 7/00* (2006.01)
*B60L 58/16* (2019.01)
*G01R 31/392* (2019.01)
*H02J 3/32* (2006.01)

(52) U.S. Cl.
CPC ............. *H02J 7/005* (2020.01); *B60L 58/16* (2019.02); *G01R 31/392* (2019.01); *H02J 7/00032* (2020.01); *H02J 7/0048* (2020.01); *H02J 7/00712* (2020.01); *H02J 3/32* (2013.01)

(58) Field of Classification Search
CPC .......... H02J 7/005; H02J 3/32; H02J 7/00032; H02J 7/0048; H02J 7/00712; B60H 1/00364; B60H 1/00428; B60H 1/00735; B60H 1/00978; G01R 31/392

USPC ....................................................... 320/134
See application file for complete search history.

(56) References Cited

U.S. PATENT DOCUMENTS

| | | | | |
|---|---|---|---|---|
| 5,596,512 A | * | 1/1997 | Wong ............... | G01R 31/3648 |
| | | | | 713/340 |
| 6,222,370 B1 | * | 4/2001 | Schousek .......... | G01R 31/3648 |
| | | | | 320/136 |
| 6,622,505 B2 | * | 9/2003 | Anderson .......... | B60H 1/00428 |
| | | | | 62/133 |

(Continued)

FOREIGN PATENT DOCUMENTS

| CN | 106114426 B | 2/2019 |
|---|---|---|
| CN | 110707804 A | 1/2020 |

(Continued)

OTHER PUBLICATIONS

Qu WIPO/PCT (Year: 2022).*
Search Report for Application No. 22153197.3; Issued Jul. 1, 2022; 8 Pages.

*Primary Examiner* — M Baye Diao
(74) *Attorney, Agent, or Firm* — CANTOR COLBURN LLP

(57) ABSTRACT

Provided are embodiments for a system and method for performing a battery health self-test protocol. The embodiments can include detecting a transport refrigeration unit (TRU) is connected to standby power, and charging the battery to a known charge level during a charge cycle. Embodiments can also include discharging the battery during a discharge cycle by coupling the battery to a battery test resistor, and calculating battery health assessment information for the battery.

19 Claims, 2 Drawing Sheets

(56) References Cited

U.S. PATENT DOCUMENTS

| | | | | |
|---|---|---|---|---|
| 7,446,510 B2* | 11/2008 | Chou | .................... | G01R 31/392 320/156 |
| 7,928,735 B2* | 4/2011 | Huang | .................... | B60L 58/15 324/426 |
| 8,315,829 B2* | 11/2012 | Zhang | ................ | H01M 10/482 702/63 |
| 8,508,191 B2* | 8/2013 | Kim | .................... | H02J 7/0024 320/132 |
| 9,878,631 B2* | 1/2018 | Hyde | ................ | B60L 1/14 |
| 10,026,998 B2* | 7/2018 | Li | ............................. | B60L 3/12 |
| 2005/0156603 A1* | 7/2005 | Lin | .................... | G01R 31/386 324/433 |
| 2011/0148424 A1* | 6/2011 | Chiang | ............. | G01R 31/3842 324/427 |
| 2016/0320107 A1* | 11/2016 | Mckay | ................ | H02K 7/1846 |
| 2017/0038436 A1* | 2/2017 | Montaru | .............. | G01R 31/367 |
| 2019/0113578 A1* | 4/2019 | Um | .................... | G01R 31/3842 |
| 2019/0193622 A1* | 6/2019 | Moon | .................... | B60L 1/003 |
| 2019/0277647 A1* | 9/2019 | Adetola | ............ | B60H 1/00771 |
| 2020/0231041 A1* | 7/2020 | Lavrich | .................... | B60P 3/20 |
| 2020/0406705 A1* | 12/2020 | Vila Soler | ............ | B60H 1/3232 |
| 2021/0213797 A1* | 7/2021 | Saroka | .................... | B60L 1/003 |
| 2021/0268864 A1* | 9/2021 | Saroka | ............... | B60H 1/00014 |
| 2021/0268908 A1* | 9/2021 | Liao | ........................ | B60L 58/15 |

FOREIGN PATENT DOCUMENTS

| | | | | |
|---|---|---|---|---|
| CN | 111025168 | A | | 4/2020 |
| CN | 111262328 | A | | 6/2020 |
| CN | 112141032 | A | * 12/2020 | ......... B60H 1/0025 |
| DE | 112014000310 | T5 | | 9/2015 |
| DE | 102014206237 | A1 | | 10/2015 |
| EP | 2655151 | B1 | | 9/2017 |
| EP | 2253059 | B2 | | 7/2018 |
| EP | 2694891 | B1 | * 1/2020 | ......... B60H 1/00428 |
| JP | 2002323280 | A | | 11/2002 |
| KR | 101991241 | B1 | | 6/2019 |
| WO | 2020068502 | A1 | | 4/2020 |
| WO | 2020068641 | A1 | | 4/2020 |
| WO | WO-2022012488 | A1 | * 1/2022 | ......... G01R 31/007 |

* cited by examiner

BATTERY HEALTH SELF-TEST PROTOCOL

CROSS-REFERENCE TO RELATED APPLICATIONS

This application claims the benefit of U.S. Provisional Application No. 63/141,531 filed Jan. 26, 2021, the disclosure of which is incorporated herein by reference in its entirety.

BACKGROUND

The present disclosure relates to battery technologies, and more specifically, to a battery health self-test protocol for transport refrigeration units (TRU).

Truck trailers used to transport perishable and frozen goods include a refrigerated trailer pulled behind a truck cab unit. The refrigerated trailer, which houses the perishable or frozen cargo, requires a refrigeration unit for maintaining a desired temperature environment within the interior volume of the container. The refrigeration unit must have sufficient refrigeration capacity to maintain the product stored within the trailer at the desired temperature over a wide range of ambient air temperatures and load conditions. Refrigerated trailers of this type are used to transport a wide variety of products, ranging for example from freshly picked produce to deep frozen seafood. Product may be loaded into the trailer unit directly from the field, such as freshly picked fruits and vegetables, or from a warehouse.

BRIEF DESCRIPTION

According to an embodiment, a method for performing a battery health self-test protocol is provided. The method can include detecting, using a controller, that a transport refrigeration unit (TRU) is connected to standby power; and charging the battery to a known charge level during a charge cycle. The method can also include discharging the battery during a discharge cycle by coupling the battery to a battery test resistor; and calculating battery health assessment information for the battery.

In addition to one or more of the features described herein, or as an alternative, further embodiments include recharging the battery to a full charge level.

In addition to one or more of the features described herein, or as an alternative, further embodiments include using the standby power that is provided from a power grid, and detecting the TRU is plugged into the power grid.

In addition to one or more of the features described herein, or as an alternative, further embodiments include recharging the battery using the standby power from a power grid.

In addition to one or more of the features described herein, or as an alternative, further embodiments include recharging the battery using only the standby power from the power grid while a generator of the TRU is not in operation.

In addition to one or more of the features described herein, or as an alternative, further embodiments include providing a prompt to connect the battery to the standby power if the standby power is not detected.

In addition to one or more of the features described herein, or as an alternative, further embodiments include using a known charge level that is less than a fully charged state of the battery.

In addition to one or more of the features described herein, or as an alternative, further embodiments include charging the battery using a generator of the TRU during the charging cycle.

In addition to one or more of the features described herein, or as an alternative, further embodiments include receiving the battery information including an age and capacity of the battery, wherein the battery information is used to calculate the battery health assessment information.

In addition to one or more of the features described herein, or as an alternative, further embodiments include outputting the battery health assessment information to a display.

According to another embodiment, a system for performing a battery health self-test protocol is provided. The system can include a battery coupled to a transport refrigeration unit (TRU), and a controller coupled to the battery. The controller is configured to detect the TRU is connected to standby power; and charge the battery to a known charge level during a charge cycle. The controller can be configured to discharge the battery during a discharge cycle by coupling the battery to a battery test resistor; and calculate battery health assessment information for the battery.

In addition to one or more of the features described herein, or as an alternative, further embodiments include a controller that is further configured to recharge the batter to a full charge level In addition to one or more of the features described herein, or as an alternative, further embodiments include using the standby power that is provided from a power grid, and detecting the TRU is plugged into the power grid.

In addition to one or more of the features described herein, or as an alternative, further embodiments include recharging the battery using the standby power from a power grid.

In addition to one or more of the features described herein, or as an alternative, further embodiments include recharging the battery using only the standby power from the power grid while a generator of the TRU is not in operation.

In addition to one or more of the features described herein, or as an alternative, further embodiments include a controller that is further configured to provide a prompt to connect the battery to the standby power if the standby power is not detected.

In addition to one or more of the features described herein, or as an alternative, further embodiments include using a known charge level that is less than a fully charged state of the battery.

18. In addition to one or more of the features described herein, or as an alternative, further embodiments include charging the battery using a generator of the TRU during a charging cycle.

In addition to one or more of the features described herein, or as an alternative, further embodiments include a controller that is configured to receive the battery information including an age and capacity of the battery, wherein the battery information is used to calculate the battery health assessment information.

In addition to one or more of the features described herein, or as an alternative, further embodiments include a display to output the battery health assessment information.

Technical effects of embodiments of the present disclosure include performing a self-test for a battery which enables the battery to be replaced on an as-needed basis instead of a prescribed schedule which may replace a battery having some remaining useful life or not replace a battery that is exhibiting premature failure.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
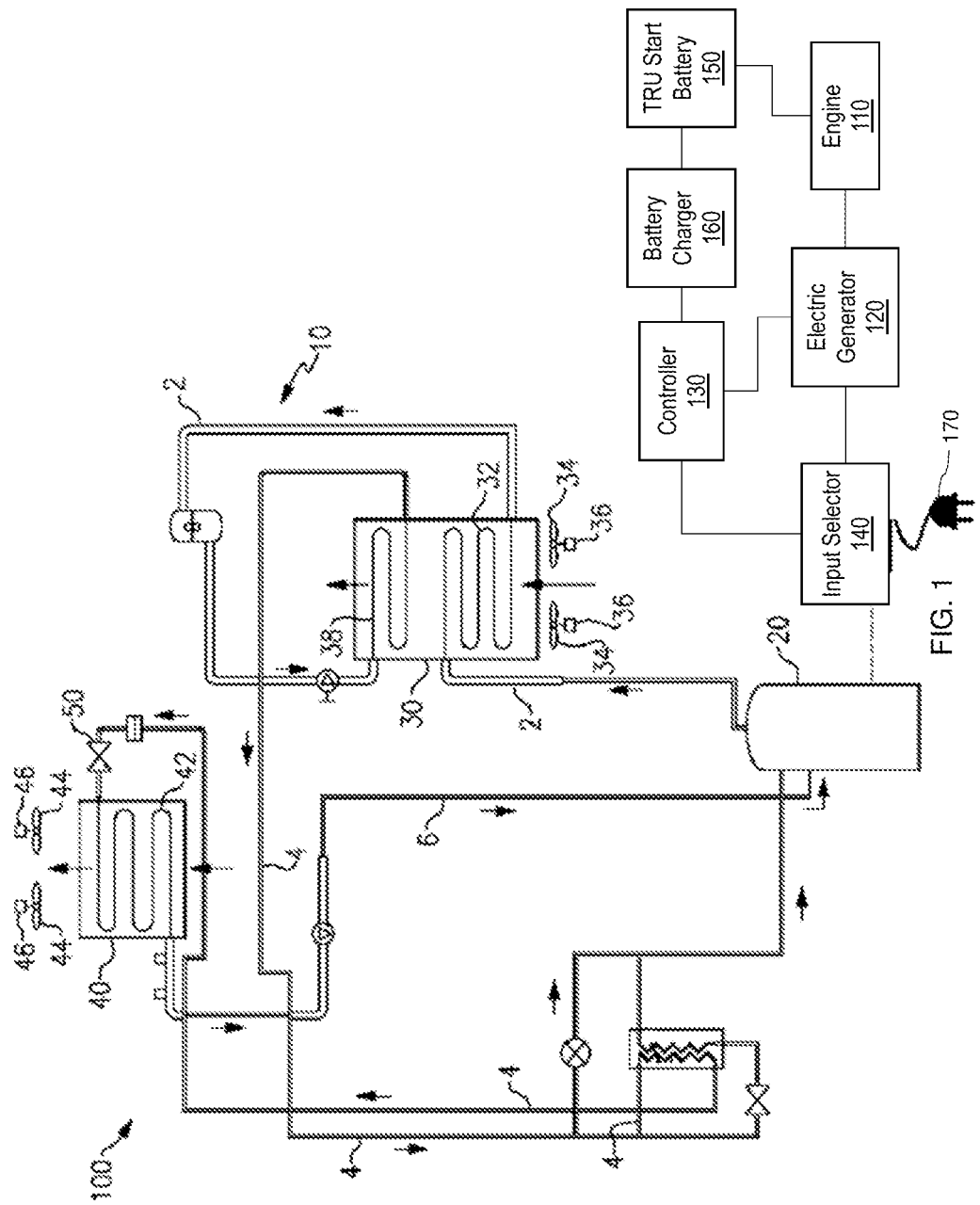
FIG. 1 depicts a schematic illustration of a transport refrigeration unit (TRU) capable of performing a battery health self-test protocol in accordance with one or more embodiments.

Referring now to FIG. 1, there is shown schematically, an exemplary embodiment of a truck trailer refrigeration system 100 including an engine 110, an electric generator 120 operatively associated with the engine 110, a system controller 130, a power input selector 140 and a transport refrigeration unit 10 (commonly referred to as a "TRU"). Also shown in FIG. 1, the engine 110 is coupled to the TRU start battery 150 (hereinafter referred to as the "battery 150"), and the battery charger 160 is coupled to the controller 130 and the battery 150. The transport refrigeration unit 10 described herein may function to regulate and maintain a desired product storage temperature range within a refrigerated volume wherein a perishable or frozen product is stored during transport, such as a refrigerated box of a trailer. As shown, the transport refrigeration unit 10 may include a compressor 20, a condenser heat exchanger unit 30 including a condenser heat exchange coil 32 and associated condenser fan 34 and fan motor 36 assembly, an evaporator heat exchanger unit 40 including an evaporator heat exchanger coil 42 and associated evaporator fan 44 and fan motor 46 assembly, and an evaporator expansion device 50, such as an electronic expansion valve (EXV) or a thermostatic expansion valve (TXV), connected in a conventional refrigeration cycle by refrigerant lines 2, 4 and 6 in a refrigerant flow circuit. The condenser heat exchanger unit 30 may also include a subcooling coil 38 disposed in series refrigeration flow relationship with and downstream of the primary condenser heat exchange coil 32. In addition, the refrigeration system can also include other components that are known to be associated with refrigeration systems such as, sensors, other expansion devices, other types of heat exchangers, valves, thermostats, receivers, filter driers, etc.

Figure 2:
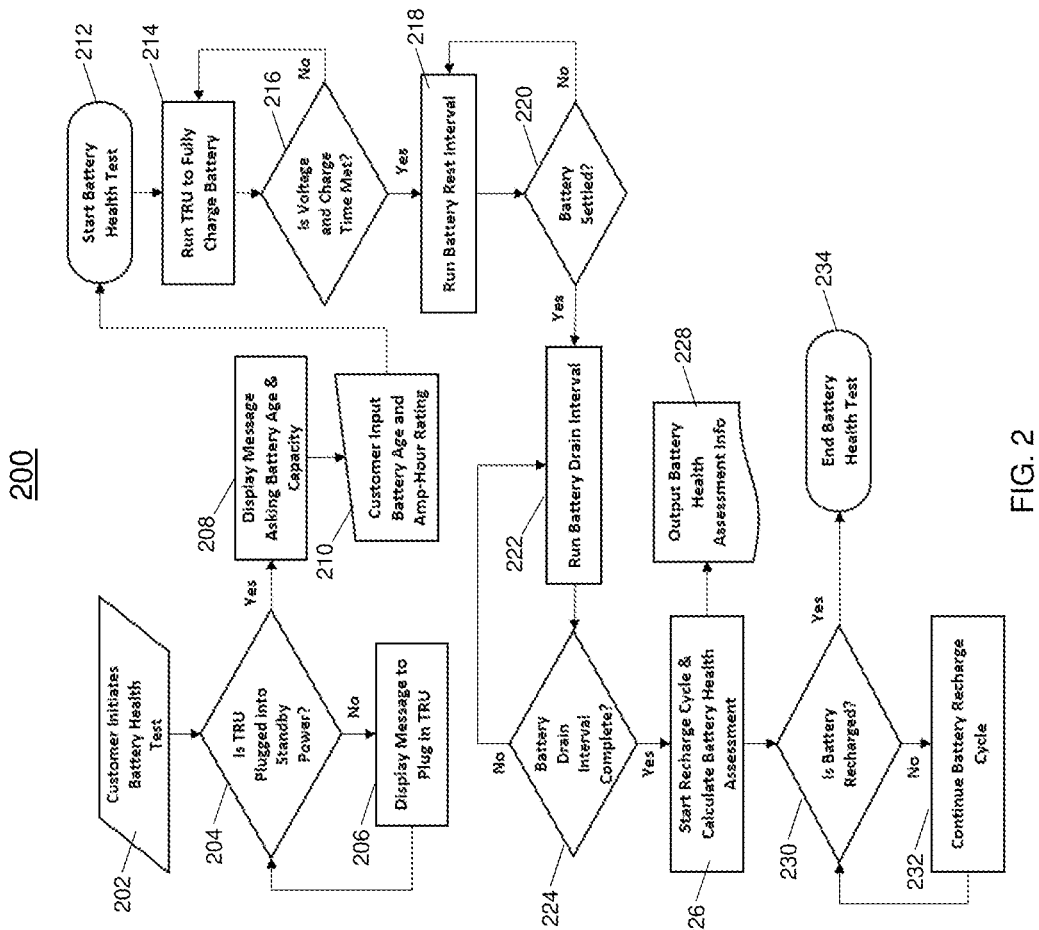
FIG. 2 depicts a flowchart of a method for performing a battery health self-test protocol in accordance with one or more embodiments.

Now referring to FIG. 2, a flowchart of a method 200 for performing the battery health self-test in accordance with one or more embodiments is shown. It should be understood the method 200 can be implemented in any suitable system, such as the system 100 shown in FIG. 1 (although other suitable systems may be used to implement the method 200 in certain instances). The method 200 begins and proceeds to block 202 to initiate the battery health self-test (referred to herein as "self-test"). In one or more embodiments, the self-test can be automatically performed according to a schedule. In different embodiments, the self-test can be performed when a manual selection is provided and input to the controller 130.

At decision block 204, the controller 130 determines whether the TRU is connected to standby power such as the power from the power grid (which may be connected using a plug 170 or other suitable connection, as shown in FIG. 1). In one or more embodiments, the controller 130 can use a voltage sensor/current sensor to determine if the TRU is coupled to the standby power. The standby power can be an external power source such as a power grid (AC power). As mentioned above, the TRU may be designed to be plugged into an outlet to receive the standby power which allows the charging of the battery 150 or provide a supply of power for other operations. In the event the TRU is not connected to the standby power ("No" branch), a message can be provided on a display of an interface to plug in the TRU at 206. The method 200 then returns to block 204 to determine if the TRU has been connected to the standby power.

If the TRU is connected to the standby power ("Yes" branch), the method 200 proceeds to block 208 and displays a message to retrieve the battery information. In some embodiments, the battery information can be retrieved automatically from one or more sources the controller 130 may have access to such as a battery/power system, a diagnostic system (e.g., onboard diagnostic system (ODB)), or another type of TRU-related system. In other embodiments, the battery information can be manually input by an operator (block 210) and provided to the controller 130 and used for battery calculations. The battery information can include but is not limited to the battery age and capacity. It should be understood that additional information can be retrieved and input into the controller 130 to perform the self-test and is not intended to be limited by that shown in FIG. 2.

The method 200 continues to block 212 and starts the self-test and proceeds to block 214 which operates the TRU to charge the battery 150 (either fully or partially). In one or more embodiments, an engine 110 that converts fuel to mechanical energy to drive a generator 120 of the TRU is used to generate power to charge the battery to a known level to perform the self-test. In some embodiments, the charge level of the battery 150 is charged to a known level that is less than a fully charged level. In other embodiments, the battery can be fully charged. The source of power for the generator 120 can include a fuel-type source such as diesel. In one or more embodiments, the engine 110 of the TRU that drives the generator 120 is not in operation during the self-test.

At block 216, the controller 130 checks the voltage and charge time of the battery 150. If the expected voltage level and charge time are not met, the TRU continues to charge the battery to the expected level. If the voltage level and charge time are met ("Yes" branch), the method 200 proceeds to block 218 which runs a battery rest interval to settle the battery. The rest interval allows the charge level of the battery to settle at a voltage level and minimize the fluctuations in voltage resulting from charging so that an accurate test can be performed. At block 220, the controller 130 determines whether the battery has settled during the rest interval. In a non-limiting example, the battery can be determined to be settled if the voltage level is within a margin. If not ("No" branch) the method 200 returns to block 218 to run/continue the battery rest interval.

If the battery 150 has settled ("Yes" branch), the method 200 continues to block 222 and runs the battery drain interval (which may be referred to as the discharge cycle). During the battery drain interval a known load (i.e., a battery test resistor) is connected to the battery 150 to discharge the battery 150. At decision block 224, the battery drain interval is checked to see if it is completed. In one or more embodiments, the battery drain interval is completed responsive to reaching a predetermined or known discharge level. In other embodiments, the battery drain interval can be completed responsive to the expiration of a period of time. If the battery drain interval is not completed ("No" branch), the method 200 returns to block 222 to run/continue to battery drain interval (i.e., the discharge cycle).

Upon completion of the discharge cycle, the known load is electrically disconnected from the battery 150 to stop the discharging of the battery 150 and various battery measurements can be taken. The method 200 proceeds to block 226 to start the recharge cycle for the battery 150 and calculate the battery health assessment information. At block 228, the battery health assessment information can be output to a display.

In one or more embodiments, the battery recharge cycle only uses the wall power/grid power to recharge the battery 150. In these instances, the engine 110 and generator are not required to recharge the battery 150 immediately after performing the self-test. At decision block 230, the controller 130 determines whether the battery 150 has been fully recharged using the standby power. If not ("No" branch), the method 200 proceeds to block 232 to continue to recharge the battery 150. If the battery 150 is fully recharged ("Yes" branch), the method 200 proceeds to block 234, and the method 200 ends. The method 200 can be repeated at a scheduled time or upon manual initiation by an operator. It should be understood that a different sequence of steps or additional steps can be used.

The techniques described herein enable testing of the battery while the system is not in operation. Conventional systems are required to remain in operation to perform a battery health test. The battery can be tested and recharged to full capacity without operator intervention using the techniques described herein. The techniques described herein allow the batteries to be replaced on an as-needed basis as opposed to a prescribed maintenance schedule where usable life remains in the battery.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method for performing a battery health self-test protocol for a battery, the method comprising:
    detecting, using a controller, that a transport refrigeration unit (TRU) is connected to standby power;
    charging the battery to a known charge level during a charge cycle;
    discharging the battery during a discharge cycle by coupling the battery to a battery test resistor; and
    calculating battery health assessment information for the battery;
    wherein the standby power is provided from a power grid;
    wherein the detecting, charging, discharging and calculating occur in response to the TRU being plugged into the power grid.

2. The method of claim 1, further comprising recharging the battery to a full charge level.

3. The method of claim 2, wherein recharging the battery comprises using the standby power from a power grid.

4. The method of claim 3, wherein recharging the battery comprises only using the standby power from the power grid while a generator of the TRU is not in operation.

5. The method of claim 1, further comprising providing a prompt to connect the battery to the standby power if the standby power is not detected.

6. The method of claim 1, wherein the known charge level is less than a fully charged state of the battery.

7. The method of claim 1, wherein the charge cycle comprises charging the battery using a generator of the TRU.

8. The method of claim 1, further comprising receiving the battery information comprising age and capacity of the battery, wherein the battery information is used to calculate the battery health assessment information.

9. The method of claim 8, further comprising outputting the battery health assessment information to a display.

10. The method of claim 1, wherein the battery comprises a TRU start battery.

11. A system for performing a battery health self-test protocol, the system comprising:
    a battery coupled to a transport refrigeration unit (TRU); and
    a controller coupled to the battery, wherein the controller is configured to:
        detect the TRU is connected to standby power;
        charge the battery to a known charge level during a charge cycle;
        discharge the battery during a discharge cycle by coupling the battery to a battery test resistor; and
        calculate battery health assessment information for the battery;
    wherein the standby power is provided from a power grid;
        wherein the detecting, charging, discharging and calculating occur in response to the TRU being plugged into the power grid.

12. The system of claim 11, wherein the controller is further configured to recharge the battery to a full charge level.

13. The system of claim 12, wherein recharging the battery comprises using the standby power from a power grid.

14. The system of claim 13, wherein recharging the battery comprises only using the standby power from the power grid while a generator of the TRU is not in operation.

15. The system of claim 11, wherein the controller is further configured to provide a prompt to connect the battery to the standby power if the standby power is not detected.

16. The system of claim 11, wherein the known charge level is less than a fully charged state of the battery.

17. The system of claim 11, wherein the charge cycle comprises charging the battery using a generator of the TRU.

18. The system of claim 11, wherein the controller is further configured to receive the battery information comprising age and capacity of the battery, wherein the battery information is used to calculate the battery health assessment information.

19. The system of claim 18, further comprising a display to output the battery health assessment information.

\* \* \* \* \*